United States Patent [19]

Kamei et al.

[11] Patent Number: 5,089,719
[45] Date of Patent: Feb. 18, 1992

[54] DRIVE CIRCUIT FOR A SEMICONDUCTOR DEVICE WITH HIGH VOLTAGE FOR TURN ON AND LOW VOLTAGE FOR NORMAL OPERATION

[75] Inventors: Yoshio Kamei, Saitama; Minami Takeuchi, Tokyo, both of Japan

[73] Assignee: Kabushiki Kaisha Toshiba, Kawasaki, Japan

[21] Appl. No.: 587,807

[22] Filed: Sep. 25, 1990

[30] Foreign Application Priority Data

Sep. 29, 1989 [JP] Japan ................................. 1-254882

[51] Int. Cl.⁵ .......................................... H03K 17/72
[52] U.S. Cl. .................................. 307/270; 307/570; 307/296.3
[58] Field of Search ............... 307/570, 300, 633, 631, 307/253, 254, 296.3, 270

[56] References Cited

U.S. PATENT DOCUMENTS

| | | | |
|---|---|---|---|
| 3,927,332 | 12/1975 | McKean et al. | 307/268 |
| 4,362,955 | 12/1982 | Davenport | 307/264 |
| 4,433,257 | 2/1984 | Kinoshita | 307/296.8 |
| 4,464,585 | 8/1984 | Seki | 307/268 |
| 4,551,635 | 11/1985 | Kuroki | 307/254 |
| 4,568,837 | 2/1986 | Seki | 307/264 |
| 4,642,483 | 2/1987 | Tomita | 307/300 |
| 4,647,797 | 3/1987 | Sanwo et al. | 307/268 |
| 4,677,317 | 6/1987 | Sakuma | 307/270 |
| 4,721,869 | 1/1988 | Okado | 307/270 |
| 4,831,288 | 5/1989 | Chida et al. | 307/633 |

OTHER PUBLICATIONS

"Gating Effects on Thyristor Anode Current di/dt", IEEE Transactions on Power Electronics, vol. PE-2, No. 2, Apr. 1987.

Primary Examiner—Stanley D. Miller
Assistant Examiner—Sinh N. Tran
Attorney, Agent, or Firm—Oblon, Spivak, McClelland, Maier & Neustadt

[57] ABSTRACT

A drive circuit for a voltage-controlled type semiconductor device is provided which comprises ON gate drive circuit for supplying an ON control signal to a control electrode of the semiconductor device which performs a current switching, OFF gate drive circuit for supplying an OFF control signal to the control electrode of the semiconductor device, high voltage power source, connected to at least one of the ON gate drive circuit and OFF gate drive circuit, for supplying a control current of a predetermined current increase rate to the control electrode of the semiconductor device through at least one of the ON gate drive circuit and OFF gate drive circuit, low voltage power source, provided in juxtaposition with the high voltage power source, for supplying, to the control electrode, enough control current to hold the semiconductor device in a normal state, and switch for supplying an output of the high voltage power source to the control electrode in an earlier portion of a turn ON or a turn OFF period, and an output of the low voltage power source to the control electrode in a normally ON or a normally OFF state.

5 Claims, 4 Drawing Sheets

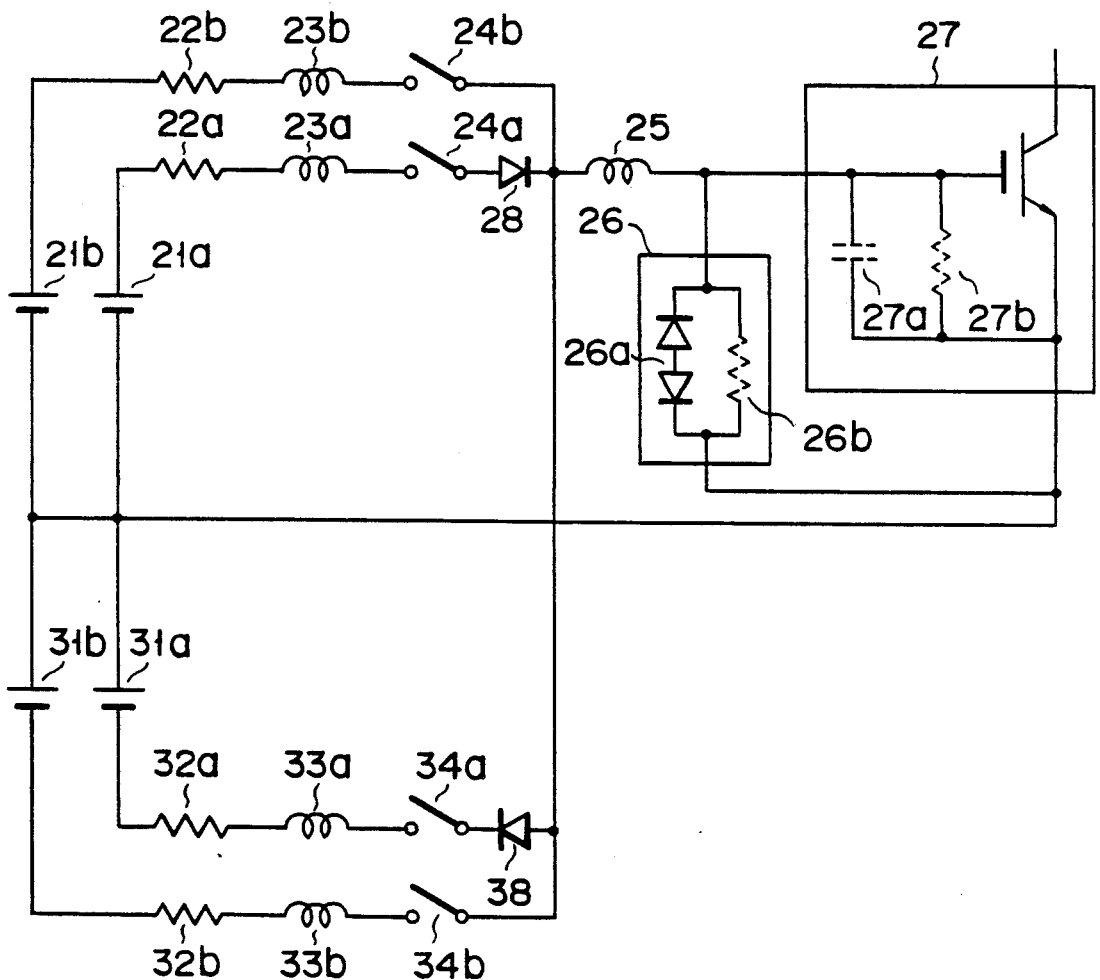
F I G. 3

5,089,719

DRIVE CIRCUIT FOR A SEMICONDUCTOR DEVICE WITH HIGH VOLTAGE FOR TURN ON AND LOW VOLTAGE FOR NORMAL OPERATION

BACKGROUND OF THE INVENTION

1. Field of the Invention

The present invention relates to a drive circuit for turning a semiconductor device with a control electrode ON and OFF.

2. Description of the Related Art

Generally, a semiconductor device, upon being switched with a high frequency wave, fails to operate at high speeds due to the presence of a stray capacitance or inductance. This phenomenon will be set forth below by taking an IGBT, that is, a current switching type power device, by way of example.

FIG. 1 shows a conventional IGBT 7 and its associated gate drive circuit. Reference numeral 1 shows a turn-ON power source; 11, a turn-OFF power source; 2 and 12 current-limiting resistors; and 4 and 14, switches for power source switching. A stray capacitance 7a and leakage resistance 7b are created across a gate-to-source circuit of IGBT 7. Stray inductances 3, 13 and 5 are present in a gate drive circuit.

FIG. 2 shows an operation timing of the gate drive circuit of such a type as set out above. A current increase rate is restricted by an averse effect of the stray inductances 3, 13 and 5 when charging and discharging occur at the stray capacitance 7a across the gate of the IGBT 7. In FIG. 2, a broken line shows, for example, a case of a higher current increase rate (not a conventional case) and a solid line a case of a lower current increase rate (a conventional case). Let it be assumed that an ON control signal is supplied to IGBT 7 at time t0. In this case, a time until a start of the turning ON of IGBT 7 as indicated by a time t1' - t0 and a time from the start of the turning ON of IGBT 7 to an ON state as indicated by a time t2' - t1', both for a lower current increase rate, is greater than a time until a start of the turning ON of IGBT 7 as indicated by a time t1 - t0 and a time from the start of the turning ON of IGBT 7 to the ON state as indicated by a time t2 - t1, both for a higher current increase rate, respectively.

From this it will be evident that the respective times t1 - t0 and t1' - t0 as involved from the application of an ON control signal to the turning ON of the IGBT 7 are waste times. When a drive frequency of IGBT 7 goes high, such waste times are lengthened for a drive period, preventing a high frequency drive. The switching times t2 - t1 and t2' - t1' from the ON to the OFF state of IGBT 7 bear a close relation to an electric power loss of IGBT 7. An increase in length of the switching time leads to an increase in electric power loss of IGBT 7, failing to perform a high-frequency drive. In order to drive IGBT 7 in a high-frequency drive mode, it is necessary to supply an ON control signal to IGBT 7 at a higher current increase rate.

The current increase rate of the ON control signal is determined by the voltage E of the power source 1 and sum L of the circuit inductances 3 and 5 and defined as E/L. The value L of the stray inductance is determined by the inductance of component parts and connection wires of an assembled circuit and is more than several hundreds of n in terms of their physical conditions. Further, the voltage E of the power source 1 which is used for the ON control signal is of several tens of bolts because it cannot be made higher than the gate/source breakdown voltage of IGBT 7. Thus the current increase rate is restricted to less than several hundreds of A/μsec. Here it is to be noted that the gate/source breakdown voltage of IGBT 7 means not a breakdown limitation level but a limitation voltage level allowable without degrading a reliability.

Although IGBT 7 has thus far been explained in connection with its turn-ON operation, the same thing can also be true in the turn-OFF operation of IGBT 7 provided that the polarities of the voltage and current are reversed in that case. That is, when an OFF control signal is applied at time t3, a time until a start of a turning ON of IGBT 7 as indicated by a time t4–t3 and a time from the start of the turning ON of IGBT 7 to the turn OFF of IGBT 7 as indicated by a time t5–54, both for a higher current increase rate, are smaller than a time until a start of a turning OFF of IGBT 7 as indicated by a time t4'–t3 and a time from the start of the turning OFF of IGBT 7 to the turning OFF as indicated by a time t5'–t4', both for a lower current increase rate. In order to drive IGBT 7 in a high-frequency drive mode, it is necessary to have a higher current increase rate in the same way as that in which IGBT 7 is turned ON. However it is not possible to obtain an adequately great current increase rate because the power source voltage is restricted by withstand voltage of IGBT 7 and the stray inductance of the circuit is present.

After IGBT 7 has reached a normal ON or a normal OFF state, it is only necessary to supply very small currents $i_{lip}$, $i_{lin}$ as shown in FIG. 2 to the leakage resistance 7b connected across the gate and source of IGBT 7. In this respect, IGBT 7 is called a voltage-controlled type.

As set out above, in order to drive a control electrode-equipped semiconductor device at high speeds in ON/OFF drive fashion, a higher current increase rate is required for gate drive. However, problems arise from the fact that, for example, a power source voltage cannot be made higher due to a restriction imparted thereto by the withstand voltage of the device and that no adequately high current increase rate is obtained because the stray inductance of a drive circuit cannot be disregarded.

SUMMARY OF THE INVENTION

It is accordingly the object of the present invention to provide a drive circuit for a semiconductor device which can be turned ON or OFF at high speeds.

According to the present invention, there is provided a drive circuit for a voltage-controlled type semiconductor device, which comprises:

ON gate drive means for supplying an ON control signal to a control electrode of the semiconductor device which performs a current switching;

OFF gate drive means for supplying an OFF control signal to the control electrode of the semiconductor device;

high voltage power source means, connected to at least one of the ON gate drive means and OFF gate drive means, for supplying a control current of a predetermined current increase rate to the control electrode of the semiconductor device through at least one of the ON gate drive means and OFF gate drive means;

low voltage power source means, provided in juxtaposition with the high voltage power source means, for supplying, to the control electrode, enough control current to hold the semiconductor device in a normal state; and switch means for supplying an output of the high voltage power source means to the control electrode in an earlier portion of a turn ON or a turn OFF period, and an output of the low voltage power source means to the control electrode in a normally ON or a normally OFF state.

Preferably, a voltage limitation circuit is connected to the control electrode of the semiconductor device so as to prevent a voltage which exceeds the breakdown voltage of the device from being applied from the high voltage power source to the semiconductor device.

According to the present invention, an ON control signal, or an OFF control signal, of a high current increase rate is supplied from the high voltage power source to the control electrode of the semiconductor device, so that the device can be turned ON or OFF at high speed.

If the voltage limitation circuit is provided for the control electrode of the semiconductor device, the device is prevented from being destroyed, or lowered in its reliability, even if the output voltage of the high voltage power source exceeds the breakdown voltage of the device.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a circuit diagram showing an IGBT drive circuit according to an embodiment of the present invention.

DETAILED DESCRIPTION OF THE PREFERRED EMBODIMENTS

Figure 1:
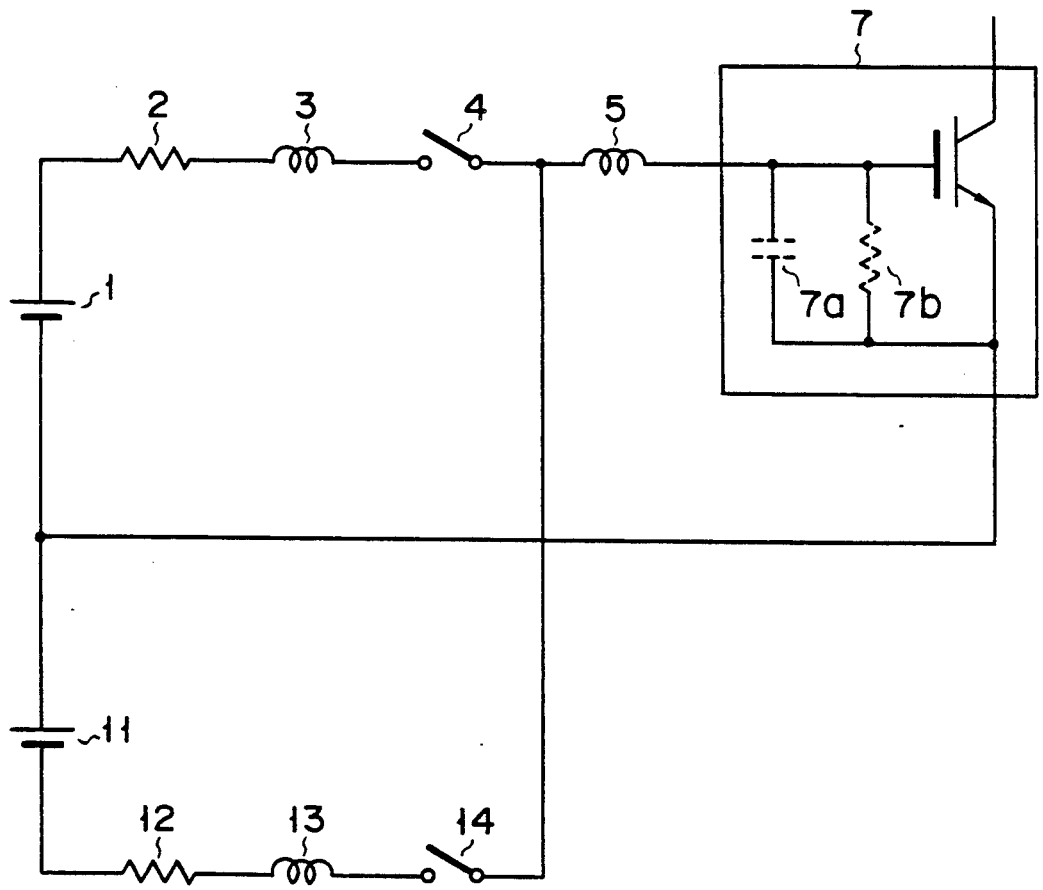
FIG. 1 is a circuit diagram showing a conventional IGBT drive circuit.
Figure 2:
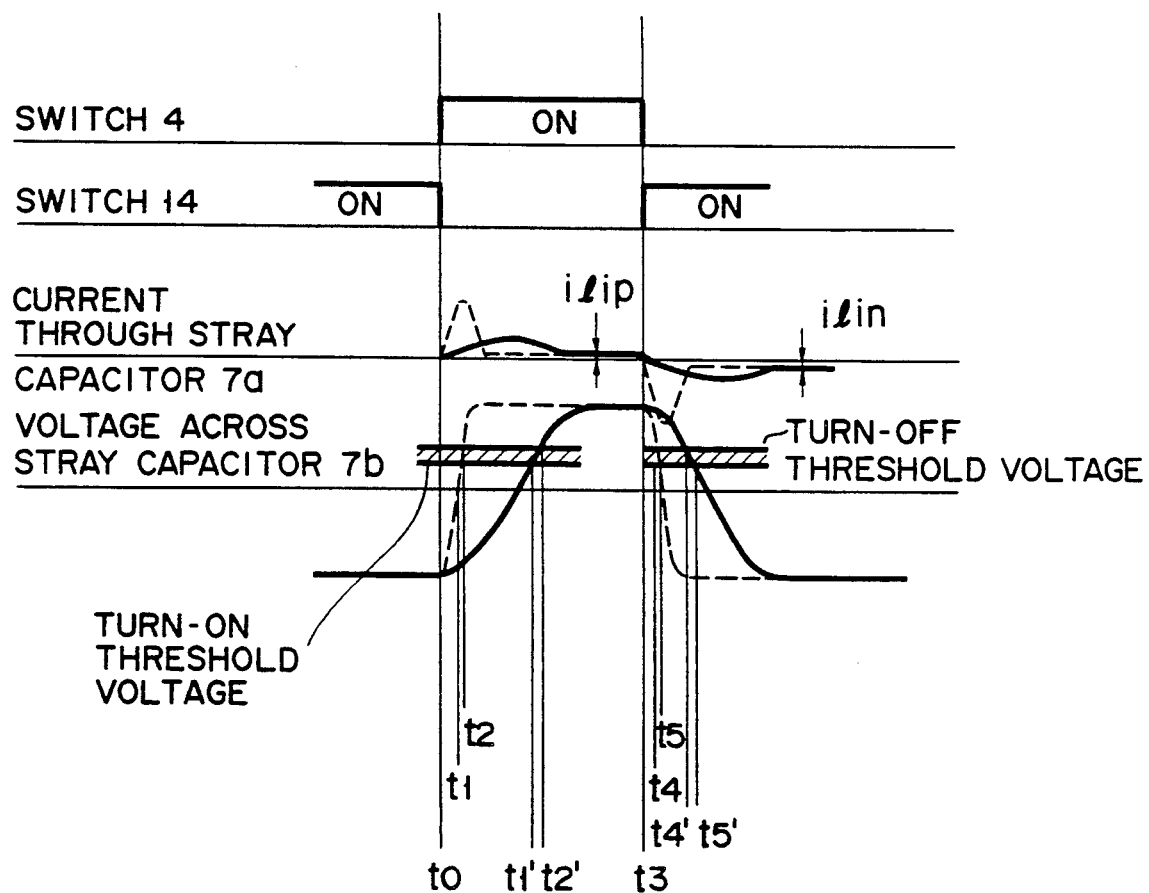
FIG. 2 is a timing chart for explaining the operation of the conventional IGBT drive circuit.

FIG. 3 shows an IGBT gate drive circuit according to one embodiment of the present invention.

A power source for an ON gate drive circuit is composed of a low voltage power source 21a and high voltage power source 21b which are provided in juxtaposition each other. The output of the low voltage power source 21a is supplied to a gate terminal of an IGBT 27 via a current limitation resistor 22a and changeover switch 24a, such as MOSFET. The output of the high voltage power source 21b is supplied to the gate terminal of IGBT 27 via a current limitation resistor 22b and changeover switch 24b, such as MOSFET. In order for the high voltage power source 21b to supply, to IGBT 27, a current whose current increase rate exceeds several hundreds of A/$\mu$sec, the output voltage is set to a level exceeding the gate/source breakdown limitation voltage of IGBT 27. The low voltage power source 21a is set to a level at which a current enough adequate to maintain IGBT 27 in a normally ON state can be supplied to IGBT 27.

An OFF gate drive circuit is also composed of a low voltage power source 31a and high voltage power source 31b. The output of the low voltage power source 31a is supplied to the gate of IGBT 27 via a current limitation resistor 32a and changeover switch 34a, such as MOSFET. The output of the high voltage power source 31b is supplied to the gate terminal of IGBT 27 via a current limitation resistor 32b and changeover switch 34b, such as MOSFET. In order for the high voltage power source 31b to supply, to IGBT 27, a current whose current increase rate exceeds several hundreds of A/$\mu$sec, the output voltage is set to a level exceeding a gate/source breakdown voltage of IGBT 27. The low voltage power source 31a is set to a level at which a current enough great to maintain IGBT 27 in a normal OFF state is supplied to IGBT 27. A diode 28 is so provided as to serve as a reverse flow element for preventing a flow of current from the high voltage power source 21b back to the low voltage power source 21a. A diode 38 is so provided as to act as a reverse flow element for preventing a flow a current from the high voltage power source 31b back into the low voltage power source 31a.

Across the gate and source of IGBT 27 a voltage limitation means 26 is connected in a manner to have zener diodes connected as a back-to-back series circuit. The voltage limitation means 26 is so provided as to prevent IGBT 27 from being destroyed, or lowered in reliability, when the output voltages of the high voltage power sources 21b and 31b are applied directly to the gate and source of IGBT 27.

A stray capacitance 27a and leakage resistance 27b are present between the gate and source of IGBT 27. Stray inductances 23a, 23b, 33a, 33b and 25 are present in a gate drive circuit. A leakage resistor 26b is connected in parallel with the aforementioned back-to-back series circuit.

The operation of the gate drive circuit thus constructed will be explained below with reference to a timing chart shown in FIG. 4. At a turn-ON time, the switches 24a and 24b are rendered ON at time t1 to allow respective currents from turn-ON power source 21a, 21b to be supplied to the stray capacitance 27a at the gate/source circuit of IGBT 27. The stray capacitance 27a is charged at a current increase rate exceeding several hundreds of A/$\mu$sec substantially determined by the high voltage power source 21b, provided that the current increase rate from the high voltage power source 21b is adequately higher than that from the low voltage power source 21a. When the charging voltage of the stray capacitance 27a reaches a threshold voltage of IGBT 27, IGBT 27 is placed at a turned-ON state at time t1'. When, at time t2, the charging voltage of the stray capacitance 27a reaches a limitation voltage value V1 determined by the voltage limitation means 26, a subsequent voltage at the stray capacitance is held at that limitation voltage value V1. Then a current flows from the turned-ON power source to the voltage limitation means 26. When the current reaches a level $i_{rp}$ determined by the current limitation resistor 22b, it is maintained at that level at a subsequent time.

After a voltage at the stray capacitance 27a between the gate and source circuit of IGBT 27 has reached the limitation voltage V1, that current supplied from the turned ON power source is not necessary to the turned ON operation of IGBT 27. For this reason, the switch 24b is turned OFF at a proper time t3 after time t2, preventing a supply of any waste current. Stated in another way, of those power sources for turn ON use, the high voltage power source 21b is employed only for an initial portion of a turn ON time.

At time t3 and the following, only current from the low voltage power source 21a is supplied to IGBT 27 and voltage at the gate/source voltage of IGBT 27 is held at a constant level. At this time, if the voltage limitation value of the voltage limitation means 26 is set to be substantially equal to, or somewhat higher than, the output voltage level of the low voltage power source 21a, then it is not necessary to supply almost no appreciable current to the voltage limitation means 26. In a normally ON state, a current $i_{lip}$ flowing across the leakage resistor 27b at the gate/source circuit of IGBT 27 and a current $i_{lcp}$ flowing across the leakage resistor 26b at the voltage limitation means 26 are held at a lower level than that of the low voltage power source 21a.

The turn OFF operation is similar to the turn ON operation if they are considered with their polarities of voltage and current reversed. At time t4, the switch 24a of the ON drive circuit is turned OFF and the switches 34a and 34b of the OFF gate drive circuit are turned ON. At a higher current increase rate substantially determined by the high voltage power source 31b for turn OFF use, IGBT 27 is supplied at its gate with an OFF gate signal and placed in an turn OFF state at time t4'. At time t5, a voltage to be applied to IGBT 27 is restricted by the voltage limitation means 26. The switch 34b is turned OFF at a proper time t6 thereafter, stopping a waste current supply from the high voltage power source 31b. Put it in another way, the current $i_{lin}$ flowing across the leakage resistor 27b at the gate/source circuit of IGBT 27 and the current $i_{lcn}$ flowing across the leakage current 26b in the voltage limitation means 26 are held, in a normal OFF state, at a lower level which is determined by the low voltage power source 31a.

Figure 4:
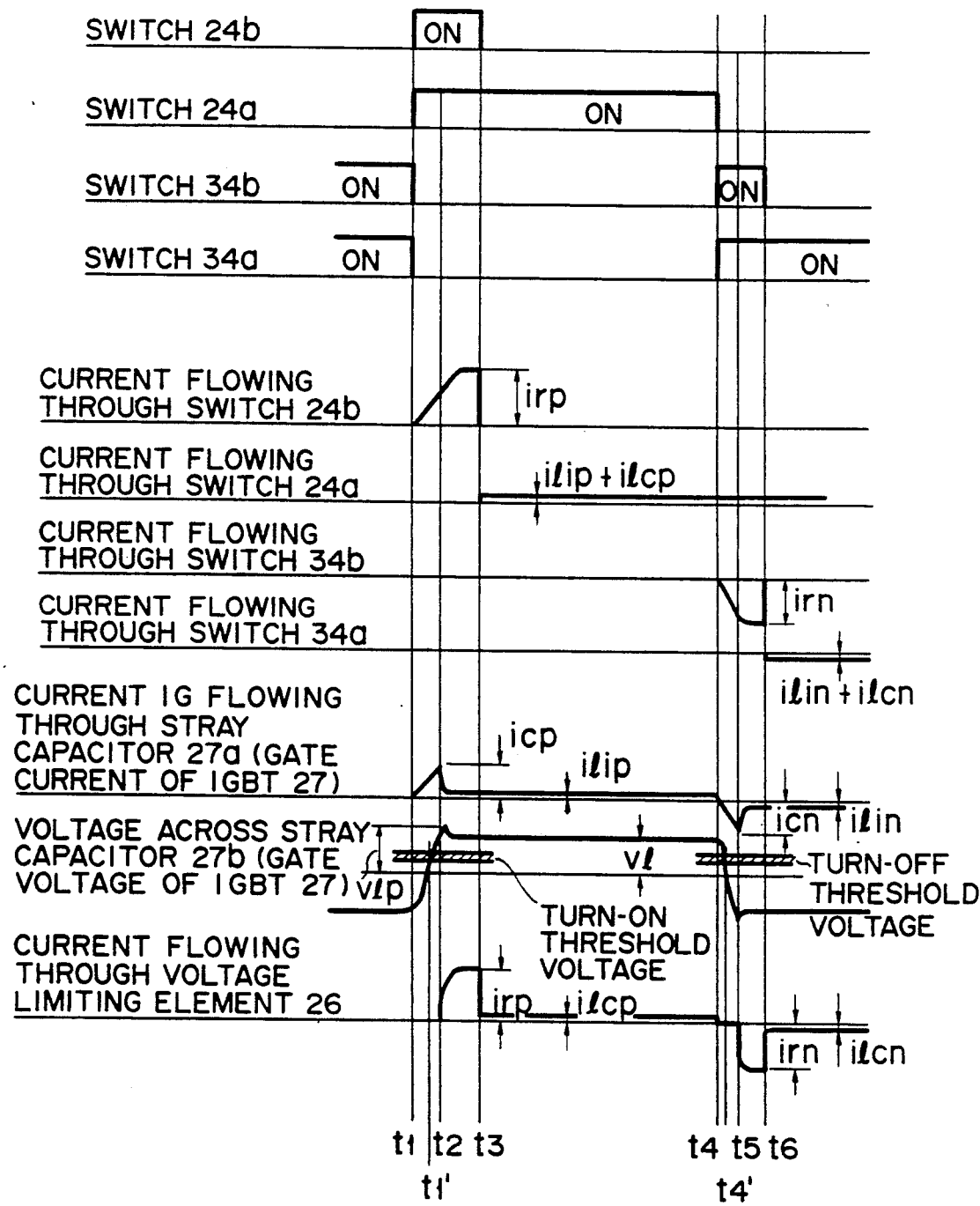
FIG. 4 is a timing chart for explaining the operation of the IGBT drive circuit shown in FIG. 3.

As shown in FIG. 4, a voltage Vlp exceeding the limitation voltage level of the voltage limitation means 26 is transiently generated in the neighborhood of time t2 at the turn-ON time and the time t5 at the turn OFF time. Since, however, the excessive voltage Vlp occurs over a very brief period of time, no adverse effect is imparted to the characteristics of IGBT 27.

According to this embodiment, a current whose higher current increase rate is more than several hundreds of A/μsec is supplied from the high voltage power sources 21b and 31b to IGBT 27 at the initial turn ON or turn OFF period, allowing a high-speed switching operation of IGBT 27. Since the high voltage power sources 21b and 31b are employed for the earlier portion of the turn ON or turn OFF period, a current capacity of any appreciable extent is not required, causing no increase in the capacity of a drive circuit and in costs involved. Even if the output voltage values of the high voltage power sources 21b and 31b exceed the breakdown voltage of IGBT 27, they are not applied directly to the IGBT's gate/source circuit due to the presence of the voltage limitation means 26, not impairing the reliability of IGBT 27.

The present invention is not restricted to the aforementioned embodiment. Although, in the embodiment, for example, the drive circuit for IGBT has been explained above, the present invention is also applied to a voltage-controlled type current switching device, such as an MOSFET or an insulated gate type thyristor.

Although, in the embodiment, high-speed turn ON and turn OFF operations have been explained, the present invention can effectively be applied to either one of the ON gate drive circuit or OFF gate drive circuit.

Further, in the aforementioned embodiment, zener diodes are employed as the current limitation means, but use may also be made of other voltage limitation devices of nonlinear characteristics. Resistors may be employed to obtain a limitation voltage in which case a divided voltage is obtained from the current limitation resistors 22a and 32a and current limitation resistors 22b and 32b.

If the device has enough great a breakdown voltage, it is not always necessary to provide the voltage limitation means. Even in this embodiment, the same advantage can be obtained if us is made of two types of power sources, that is, high voltage power sources for obtaining a high current increase rate and low voltage power sources for maintaining a normal state.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A drive circuit for a voltage-controlled type semiconductor device, comprising:
   ON gate drive means for supplying an ON control signal to a control electrode of the semiconductor device which performs a current switching;
   OFF gate drive means for supplying an OFF control signal to the control electrode of the semiconductor device;
   high voltage power source means, connected to at least one of the ON gate drive means and OFF gate drive means, for supplying a control current of a predetermined current increase rate to the control electrode of the semiconductor device through at least one of the ON gate drive means and OFF gate drive means;
   low voltage power source means, provided in juxtaposition with the high voltage power source means, for supplying, to the control electrode, enough control current to hold the semiconductor device in a normal state; and
   switch means connected to both the ON and OFF gate drive means for supplying an output of the high voltage power source means to the control electrode in an earlier portion of a turn ON or a turn OFF period, and an output of the low voltage power source means to the control electrode in a normally ON or a normally OFF state.

2. The drive circuit according to claim 1, wherein at least one of said ON gate drive means and OFF gate drive means includes a first current limitation resistor connected to said high voltage power source means; and a second current limitation resistor connected to said low voltage power source means.

3. The drive circuit according to claim 1, further comprising voltage limitation means, connected to said control electrode of said semiconductor device, for limiting a voltage which is applied to said control electrode to a predetermined level.

4. The drive circuit according to claim 3, wherein said ON gate drive means and said OFF gate drive means includes a first current limitation resistor connected to said high voltage power source means and a second current limitation resistor connected to said low voltage power source means.

5. The drive circuit according to claim 1, further comprising means, provided between said high voltage power source means and said low voltage power source means, for preventing a flow of a current from said high voltage power source means to said low voltage power source means.

* * * * *